United States Patent [19]

Murrin et al.

[11] Patent Number: 4,493,758

[45] Date of Patent: Jan. 15, 1985

[54] ANODE STRUCTURE FOR A PLATING CELL

[75] Inventors: Byran Murrin, Kilmacolm, Scotland; Robert Willis, Godalming; Jeffrey Page, Woking, both of England

[73] Assignee: OMI International Corporation, Warren, Mich.

[21] Appl. No.: 547,598

[22] Filed: Nov. 1, 1983

[30] Foreign Application Priority Data

Nov. 1, 1982 [GB] United Kingdom ................. 8231144
Nov. 1, 1982 [GB] United Kingdom ................. 8231145
May 11, 1983 [GB] United Kingdom ................. 8312912

[51] Int. Cl.³ ...................... C25D 17/00; C25D 17/12
[52] U.S. Cl. ................................. 204/224 R; 204/280
[58] Field of Search .................... 204/224 R, 280, 284

[56] References Cited

U.S. PATENT DOCUMENTS

| 4,029,564 | 6/1977 | Higuchi | 204/224 R |
| 4,093,520 | 6/1978 | Koontz | 204/224 R |
| 4,186,062 | 1/1980 | Eidschum | 204/224 R |
| 4,224,117 | 9/1980 | Edwards | 204/224 R |

Primary Examiner—Thomas Tufariello
Attorney, Agent, or Firm—Richard P. Mueller

[57] ABSTRACT

A plating cell for plating edge connector tabs of printed circuit boards comprises a pair of anode structures 119, each of which has a pair of elongate anodic platinized titanium plates 131 spaced apart by an anode divider 150. Castellations in the anode structures give rise to holes 132 through which electrolyte can flow. By means of this configuration of the anode structures an even deposit of plated metal may be obtained.

6 Claims, 9 Drawing Figures

ANODE STRUCTURE FOR A PLATING CELL

The present invention relates to an anode structure for a plating cell, particularly for a cell for plating edge connector tabs for printed circuit boards.

The use of printed circuit boards to hold electronic components is ubiquitous. Such boards (or PCBs as they are known) hold components securely in place and can be arranged to do so with the minimum amount of wasted space and length of connector between components.

Another advantage of PCBs is that they can often readily be interchanged. This is made possible by the provision of a plurality of conducting portions of the PCB near its edge known as edge connector tabs. This edge can then be inserted into a socket having an appropriate number of conducting brushes, each of which connects with a respective tab on the PCB.

Copper, (often coated with tin-lead,) is a frequently used metal for providing the edge connector tabs of PCBs. The use of uncoated copper in edge connector tabs has been found to be disadvantageous in that good connection with the brushes of the socket is not always made. It has therefore been customary to plate such edge connector tabs with a better conductor such as nickel or a precious metal such as gold. These metals are expensive and attempts to cut down their wastage have frequently been made. It is conventional for PCB edge connector tabs to be plated in a multi-stage process. This process can comprise the following steps. First, any tin-lead on the edge connector tabs is stripped; then the edge connector tabs are brushed clean to remove any smut which may have formed; the copper is chemically cleaned; the copper is plated with nickel; after a further cleaning stage a gold strike is applied to the nickel followed by a gold plate; finally, after dragging out to conserve the gold, the PCBs are rinsed, dried and unloaded.

It will be appreciated that the above process applies only to the edge connector tabs of the PCB; the rest of the board can be masked off and/or appropriate controls of depth or immersion can be made to ensure that only the requisite parts are plated.

During the plating stages, the edge connector tabs themselves are connected to a source of electricity to form the cathode of a plating cell. The anode of the cell is typically an inert rod spaced apart from the edge connector tabs of the PCB and appropriate electrolyte is caused to be in contact with both the anode and the cathode.

For reasons of quality control and waste elimination, the thickness of gold plated onto edge connector tabs has routinely been measured, frequently by means of a non-destructive test such as a beta-back scatter test. A gold plate thickness of 2.5 microns is not unusual and if the thickness of gold at a point half way along the length of a randomly chosen tab is measured, it has been reported that this thickness can be kept constant plus or minus 10%.

It is often inferred from such measurements that the thickness of gold along the whole length of the tab is in the order of the value measured. However, if the thickness of gold plate is measured for several points along the length of the tab, it may be observed that the thickness of gold plate does not stay constant but has a cross-section which is concave in nature. A peak of maximum gold thickness is often found towards the end of the tab and, by moving the anode along the length of the tab and the position of this peak can be varied.

The present invention aims to provide improved uniformity of thickness of gold, or other, plate along the length of each individual tab.

According to a first aspect of the present invention, there is provided an anode structure suitable for a plating cell, the anode structure having a solid support and at least two thin elongate electrical conducting members in side by side relationship held by, for example partially within, the support.

The electrically conducting members may be wires which are partially embedded within the support, which may be block-like in the nature. The wires preferably have a diameter of from 0.5 to 2.0 mm, such as 0.7 mm, but typically have a diameter in the range of from 1.25 to 1.75 mm, for example 1.5 mm.

Instead of being wires, the electrically conducting members may be plates. With such an arrangement, the support can be made up as a sandwich of plates and appropriate insulating material. The plates may be from 0.5 to 2 mm thick, such as 0.7 mm, but are typically from 1.25 to 1.75 mm thick, for example 1.5 mm.

The electrically conducting members of the anode structure can be formed of any suitable conducting material and may be soluble or insoluble. For example, the members can be platinised titanium or gold.

It is preferred that the members are at least from 2 to 4 mm apart, preferably at least 3 mm apart, such as 3.5 mm apart (centre to centre). The members may be independently switchable and, in a particularly preferred embodiment, there are at least three electrically conducting members, at least two of which are independently switchable. It will be appreciated that such an arrangement allows the pitch between the electrically conducting members to be varied effectively at the touch of a switch.

It has frequently been difficult to provide an adequate source of electrolyte to the anode and cathode of a plating cell. Some degree of turbulent flow is usually required. This can be achieved by means of a preferred embodiment of the invention, in which the support has a plurality of holes through which electrolyte can flow.

The holes may be horizontal or inclined to the horizontal or both; preferably they are disposed along the length of the anode structure. In a particularly preferred embodiment they are between the or at least two of the electrically conducting members. The holes are desirably each of circular cross-section.

The ends of holes may form a countersink or be located in a recess to improved electrolyte and/or current flow characteristics when electrolyte flows, in use, towards a cathodic article to be plated.

In one embodiment, the holes may be formed by one member of the anode structure being castellated and abutting another member of the anode structure which may be castellated or flush. In such a case the holes may be other than between the conducting members. The holes may be rectangular, for example square, in cross section.

According to a second aspect of the present invention, there is provided an anode assembly suitable for a plating cell, the assembly comprising a pair of anode structures, each anode structure having a support and at least two thin elongate electrically conducting members in side by side relationship held by the support, in at least part of the assembly the anode structures not being parallel to each other.

In a preferred embodiment of the second aspect of the invention, the anode assembly comprises a first portion where the structures are parallel, a second portion where the structures are also parallel but spaced further apart than in the first portion, a third portion in which the structures converge and a fourth portion in which the structures are parallel and at an identical or similar distance apart as in the first portion.

Other preferred features of the second aspect of the invention are as for the first aspect *mutatis mutandis*.

According to a third aspect of the present invention, there is provided a plating cell comprising an anode structure in accordance with the first aspect, and/or an anode assembly in accordance with the second aspect of the invention and means for connecting the anode structure and an article to be plated to a source of electricity.

The invention also extends to such a plating cell in which the ratio of the distance between the two electrically conducting members to the distance, in use of the cell, between the anode structure and an article to be plated being from 3:1 to 0.5:1. preferably from 2:1 to 1:1, especially from 1.75:1 to 1.25:1. for example 1.5:1.

A plating cell in accordance with the third aspect of the invention preferably has means for moving the article to be plated; the cell would therefore desirably be suitable for plating connector tabs of printed circuit boards. Usually, at least part of the electrically conducting members would share a common plane which would be parallel to the direction of motion of an article to be plated in use of the cell.

The or each anode structure may be in the order of 2 mm from the article to be plated which functions as the cathode.

According to a fourth aspect of the invention, there is provided a method of plating an article, the method comprising moving a cathodic article to be plated past an anode structure and/or between the anode structures of an anode assembly in accordance with the first or second aspects of the invention respectively, contacting the or each anode structure and the cathodic article to be plated with electrolyte, and supplying electricity to the cathodic article to be plated and the or each anode structure.

Preferably, the article to be plated is moved through an assembly anode comprising having sequentially, a first portion where the structures are parallel, a second portion where the said structures are parallel and spaced further apart than in the first portion, a third portion where the said structures converge and a fourth portion in which the said structures are parallel and are at an identical or similar distance apart as in the first portion.

A preferred method of the invention involves the plating of nickel or a precious metal such as gold onto printed circuit board edge connector tabs.

According to a fifth aspect of the present invention, there is provided an article whenever plated by a method in accordance with the fourth aspect of the invention and/or whenever using a plating cell in accordance with a third aspect of the invention. Such an article may be a printed circuit board, edge connector tabs of which have been plated.

For a better understanding of the present invention and to show how it may be put into effect, reference will now be made, by way of example, to the accompanying drawings, in which.

Figure 1:
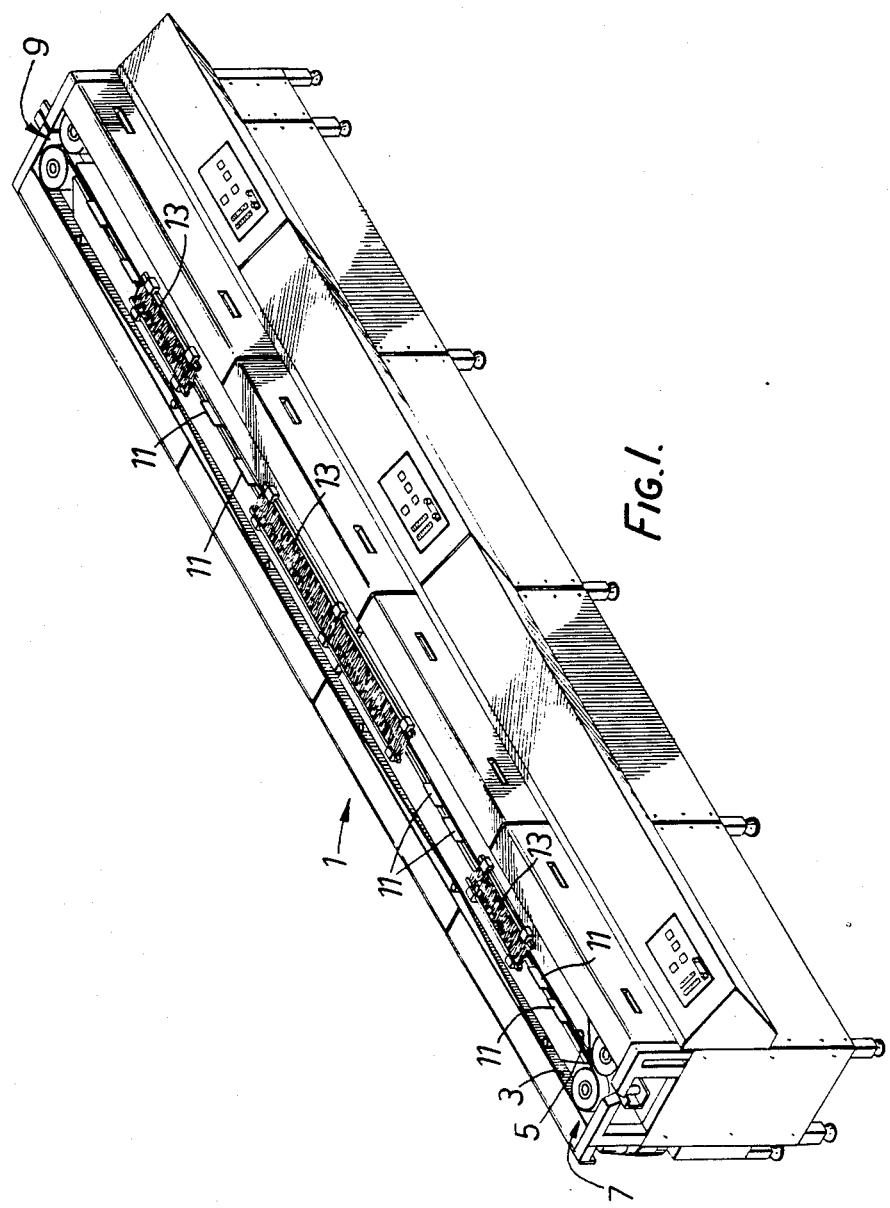
FIG. 1 shows a perspective view of a plating machine having plating cells in which an anode structure according to the invention is installed.

Referring now to the drawings, and in particular FIG. 1, there can be seen a continuous printed circuit board edge connector tab plating apparatus 1 having a pair of endless belts 3 and 5 driven by two pairs of rollers 7 and 9 at opposite ends of the apparatus. Along the length of the apparatus, the two endless belts cooperate to grip a number of printed circuit boards 11, whose lower edges, bearing edge connector tabs, are to be plated with nickel and/or gold. The pair of endless belts 3 and 5 also form to some extent a mask for keeping the electrolyte off the remainder of the boards 11.

Above each plating cell, immediately over the pair of endless belts 3 and 5 is a pair of inwardly facing wire brushes 13, by means of which electricity is supplied to the metal on each printed circuit board 11 enabling it to function as a cathode during plating.

Figure 2:
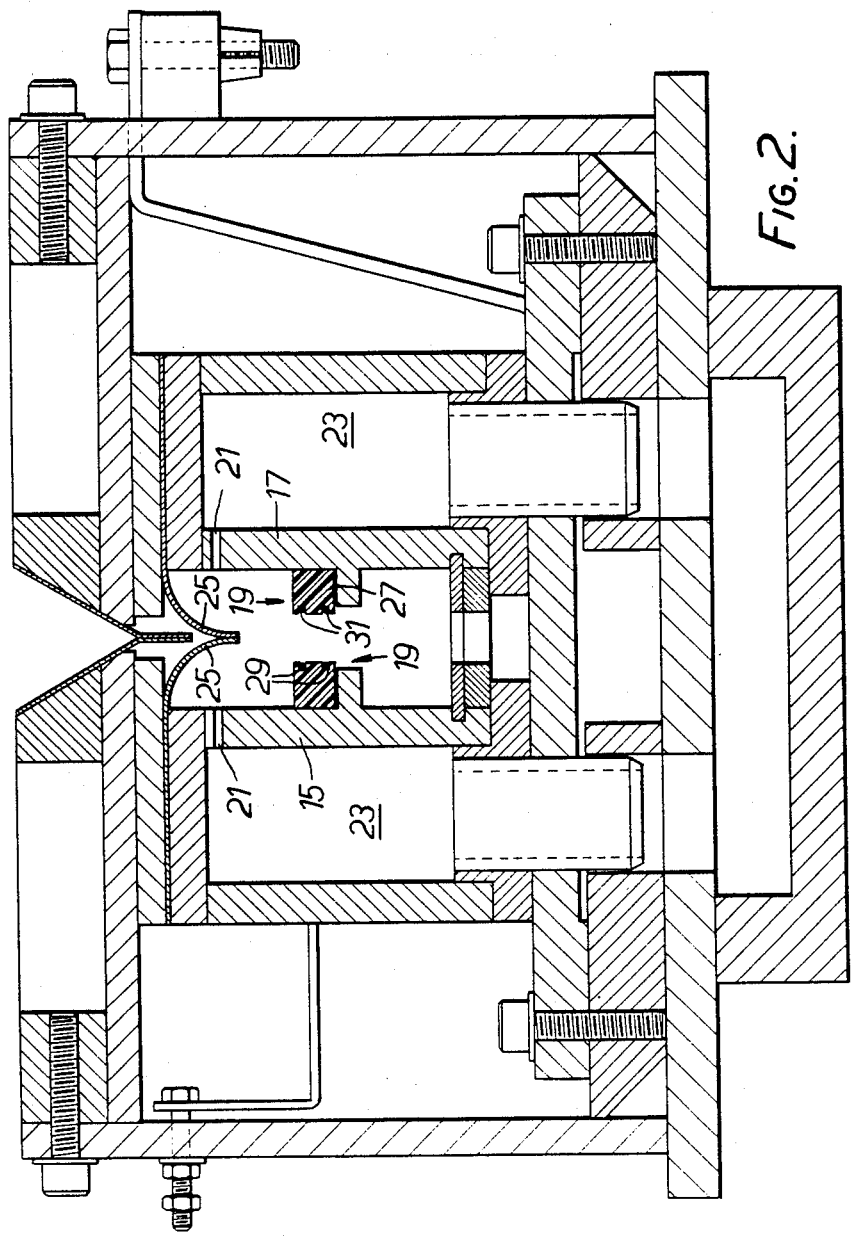
FIG. 2 shows a cross-sectional view of a plating cell and anode structure according to the invention.

FIG. 2 shows a cross-sectional view through a plating cell within the apparatus 1. The endless belts 3 and 5, the printed circuit boards 11 and the brushes 13 have been omitted for clarity.

The plating cell comprises two side walls 15 and 17, each of which bears an anode structure 19 in accordance with the invention. Above each anode structure 19, in the respective side wall 15 or 17, is formed a series of holes 21 along the length of the plating cell through which electrolyte enters the cell. The electrolyte is pumped into the holes 21 through chambers 23 on either side of the plating cell. On entering the cell, electrolyte is flowing horizontally and its flow is turned to a downward direction by means of pair of opposed curved baffles 25, between which, in use of the cell, a printed circuit board (not shown) slides. Thus the direction of traverse of a printed circuit board through the cell shown in FIG. 2 would be into or out of the plane of the paper.

Each anode structure 19 comprises a block 27 of polypropylene. It will be appreciated that any other suitable insulating material could be used for the block 27. On the side opposite that to which the respective side wall 15 or 17 is attached, are a pair of grooves 29 running the length of the cell. In each groove is a respective wire 31; together these wires form the anode of the cell. The wires are 3 mm apart and are each formed of 1.5 mm diameter platinised titanium. In use of the cell, they are located 2 mm from edge connector tabs to be plated.

Figure 3:
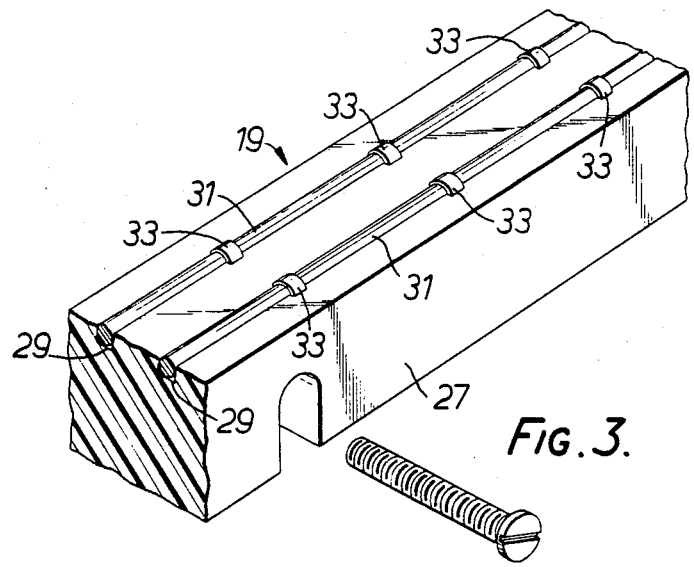
FIG. 3 is a perspective view of a first embodiment of an anode structure in accordance with the invention.

In the perspective part cut away view of FIG. 3, it can be seen that the wires 31 are each held in place by a series of bridges 33 over the grooves 29.

Figure 4:
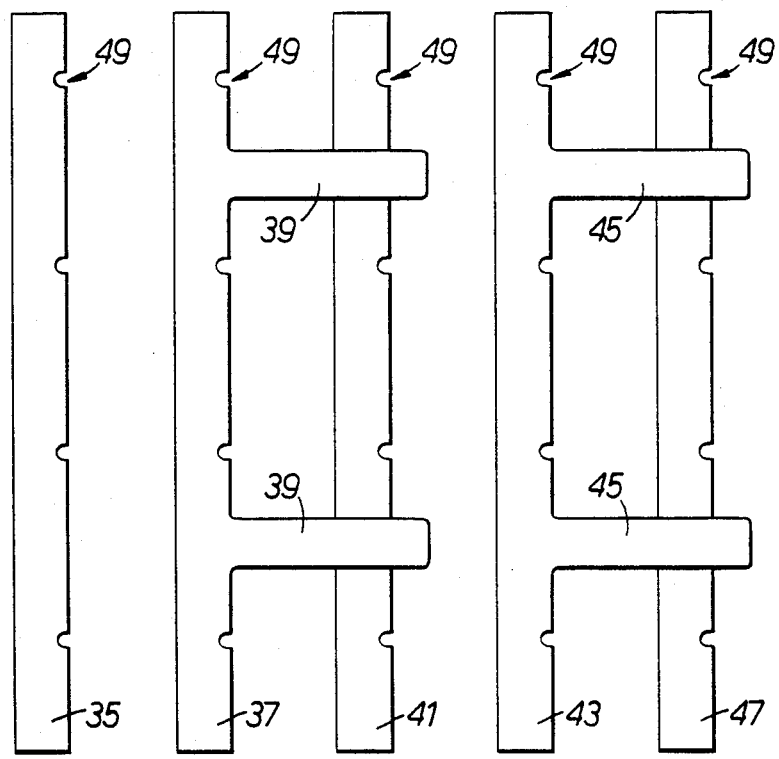
FIG. 4 shows a plan view of a dismembered anode structure which is a second embodiment of the present invention.

An alternative anode structure is shown in FIG. 4. In this anode structure, the electrically conducting members are formed by plates. It will be seen from FIG. 4 that in this embodiment there are five elongate rectangular plates which are to be superposed to form the anode structure. The left-hand plate shown in FIG. 4 will be the uppermost when the structure is assembled and the right-hand plate will be the lowermost. The upper plate 35 is of insulating material and lies on top of a second plate 37 which may be of platinised titanium or which may be of stainless steel plated with, for example, gold. The second plate 37 is equipped with a pair of connecting limbs 39 extending at right angles from one side of the main portion of the plate 37 and lying in the same plane. The connecting limbs 39 enable current to be supplied to the anode structure. The third layer 41 is an insulating layer and is the middle layer when the anode structure is assembled. The fourth layer 43 is identical to the second layer 37 and is again a conducting member having a pair of connecting limbs 45 for the purpose already mentioned. The fifth layer, which will be lowermost when the anode structure is assembled, is an insulating layer.

The anode structure shown in FIG. 4 may be assembled so that the conducting layers 37 and 43 slightly protrude to the left from the insulating layers. Each of the layers may be provided with a number of small rebates 49 which are superposed when the anode structure is assembled so that suitable fastening means may bind the layers together. The layers may, however, be fastened or fixed together in any appropriate way such as by means of resin.

Figure 5:
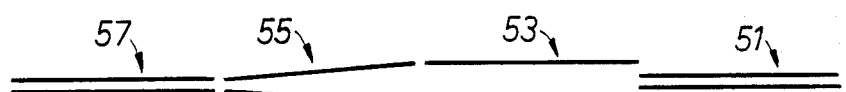
FIG. 5 is a schematic representation of an assembly comprising anode structure(s) in accordance with the invention.

FIG. 5 is a schematic plan view of an assembly comprising opposed anode structures. The assembly of FIG. 5 comprises four portions: a first portion 51, a second portion 53, a third portion 55 and fourth portion 57. A printed circuit board whose tabs are to be plated passes between the pairs of structures forming the portions in that order. In the first portion 51, the structures are parallel; in the second portion 53, the anode structures are still parallel but further apart than in the first portion; in the third portion 55, the anode structures converge from the distance they were apart in the second portion to the distance they were apart in the first portion; and in the fourth portion 57 the anode structures are parallel and are the same distance apart as they were in the first portion 51. It has been found that this arrangement gives a particularly acceptable coating on printed circuit board edge connector tabs.

Figure 6:
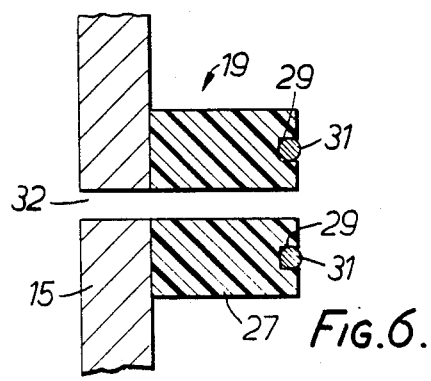
FIG. 6 shows a cross-sectional view through a further anode structure according to the invention.

In FIG. 6 is shown a further view, in cross-section, of the anode structure 19 in the plating cell shown in FIG. 2. The anode structure 19 is fixed to the cell side wall 15 and comprises a block 27 of polypropylene, in which a pair of grooves 29 run the length of the cell. A respective wire 31 is in each of the pair of grooves 29. Through the side wall 15 and the block 19 extends a row of holes 32 which connects with the electrolyte chamber 23 and which emerges into a plating cell between the wires 31. Electrolyte is supplied to the cell through these holes. The holes 21 from the electrolyte chamber 23 to the plating cell through the cell wall 15 are only optional and can be omitted if desired.

Figure 7:
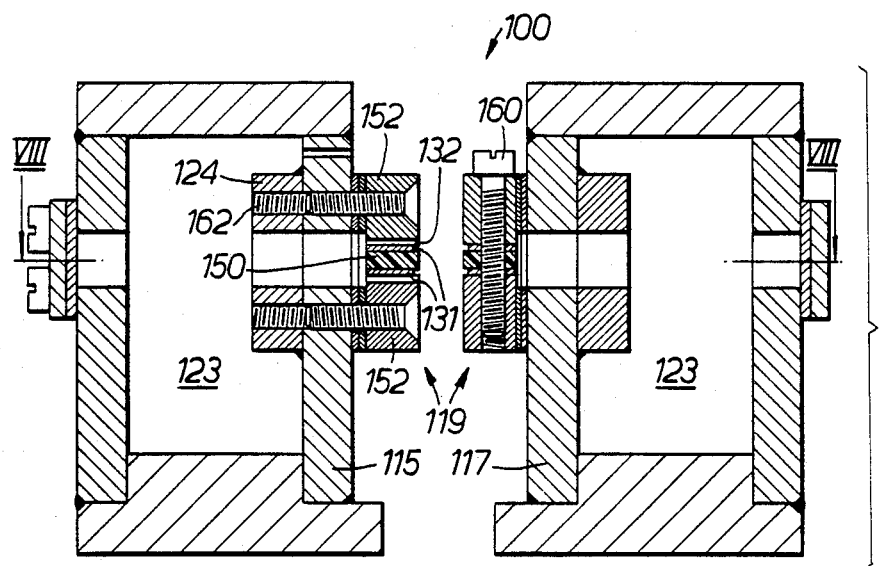
FIG. 7 shows a cross-sectional view through another embodiment of a plating cell in accordance with the invention.
Figure 8:
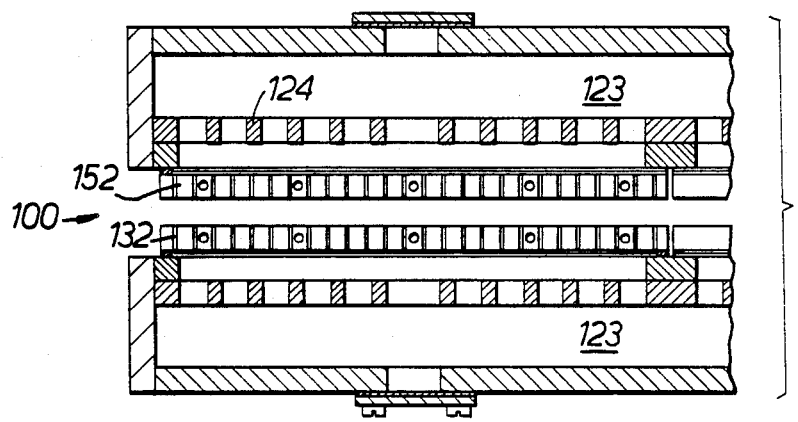
FIG. 8 shows a reduced-scale cross-sectional view of part of the cell shown in FIG. 7 taken along the line VIII—VIII.
Figure 9:
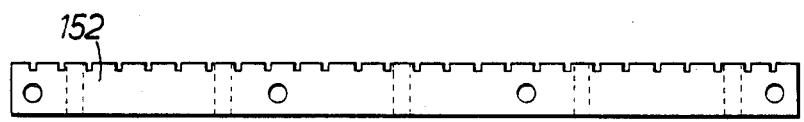
FIG. 9 shows a side elevational view of one of the components of the cell illustrated in FIGS. 7 and 8.

FIGS. 7 and 8 show a plating cell 100 comprising two side walls 115 and 117, each of which bears an anode structure 119. Each anode structure 119 comprises a pair of anodic platinised titanium plates 131 spaced apart by a plastic material anode divider 150. On the side of each platinised titanium plate 131 away from the divider abuts a respective elongate abutting member 152, the lower one of which can be seen in side elevation in FIG. 9. The plates 131 do not project from the anode structure 119 as a whole but instead are recessed, as can be seen from FIG. 7. The face of each abutting member 152 which abuts the respective plate 131 is castellated; thus holes 132 are formed in the anode structures 119 and these communicate with chambers 123 for the supply of electrolyte to cathodic tabs of a PCB to be plated which passes between the anode structures 119 shown in FIG. 7.

Each anode structure 119, comprising the upper and lower abutting members 152, upper and lower plates 131 and divider 150, is held together by a series of vertically aligned screws 160 in appropriately tapped screw holes. The anode structures 119 are each held in place by horizontally extending screws 162 which extend through an anode structure 119, a wall of one of the chambers 123 and a perforated back plate 124. Appropriate countersinking on the surface of the anode structure intended to face the pcbs may aid electrolyte flow characteristics. The titanium plates used are preferably platinised to a minimum thickness of 7.5 microns.

What is claimed is:

1. An anode assembly suitable for a plating cell, the assembly comprising a pair of anode structures, each anode structure having a support and at least two thin elongate electrically conducting members in side by side relationship held by the support and wherein, in at least part of the assembly, the anode structures are not parallel to each other.

2. An anode assembly as claimed in claim 1 wherein the anode assembly comprises a first portion where the structures are parallel, a second portion where the structures are also parallel but spaced further apart than in the first portion, a third portion in which the structures converge and a fourth portion in which the structures are parallel and at an identical or similar distance apart as in the first portion.

3. A plating cell comprising an anode assembly as claimed in claim 1 and means for connecting each anode structure and an article to be plated to a source of electricity.

4. A plating cell as claimed in claim 3 wherein the ratio of the distance between the two electrically conducting members to the distance between each of the anode structures and an article to be plated is from 3:1 to 0.5:1.

5. A plating cell as claimed in claim 4 which also comprises means for moving the article to be plated.

6. A plating cell as claimed in claim 5 wherein at least part of the electrically conducting members share a common plane parallel to the direction of motion of an article to be plated in use of the cell.

* * * * *